United States Patent [19]

Akiyama

[11] Patent Number: 5,561,671
[45] Date of Patent: Oct. 1, 1996

[54] SELF-DIAGNOSTIC DEVICE FOR SEMICONDUCTOR MEMORIES

[75] Inventor: Tsutomu Akiyama, Tokyo, Japan

[73] Assignee: Ando Electric Co., Ltd., Tokyo, Japan

[21] Appl. No.: 545,314

[22] Filed: Oct. 19, 1995

[30] Foreign Application Priority Data

Oct. 31, 1994 [JP] Japan .................................. 6-290422

[51] Int. Cl.$^6$ ............................ G11C 29/00; G06F 11/00
[52] U.S. Cl. ............................................ 371/48; 371/21.1
[58] Field of Search ......................... 371/48, 21.1, 21.2, 371/24, 25.1, 67.1; 364/265.3, 265; 395/183.16, 183.18; 365/201, 205

[56] References Cited

U.S. PATENT DOCUMENTS

| 4,430,735 | 2/1984 | Catiller ..................................... 371/25 |
| 4,672,583 | 6/1987 | Hakaizumi ............................. 365/201 |
| 4,788,684 | 11/1988 | Kawaguchi et al. .................... 371/21.2 |
| 4,811,294 | 3/1989 | Kobayashi et al. .................... 371/21.2 |

FOREIGN PATENT DOCUMENTS 6-75023  3/1994  Japan .

Primary Examiner—Robert W. Beausoliel, Jr.
Assistant Examiner—Trinh Tu
Attorney, Agent, or Firm—Finnegan, Henderson, Farabow, Garrett & Dunner, L.L.P.

[57] ABSTRACT

A self-diagnostic device for checking the performance of memory matrix in semiconductor devices is presented. The device is applicable particularly to those IC testers having high bit and high capacity memories. The device is capable of performing march and checker tasks simultaneously. The program data contained in a CPU 1 are written into the memory matrix 5 by way of the data generation circuit 2 and the address generation circuit 3. The test data are entered into a comparator 4 at the timing governed by the clock generation circuit 6, and are compared with the expected data from the data generation circuit 2. When there is a non-coincidence, a defect signal is generated from a flip-flop (FF) circuit 9. In the present device, the conventional division circuits are replaced by two FF circuits 8, 9, and two EOR-gates 11, 12 and associated components to provide simplicity in circuit configuration and efficient operation while retaining the advantages offered by the conventional march- and checker-modes. The FF circuit 8 provides a set/reset-signal in response to a clock signal from the clock generation circuit 6. The EOR-gate 12 operates so as to generate an inverted signal of the lowermost bit A0 of either the output data from the FF circuit 8 or from the address generation circuit 3. The EOR-gate 11 generates inverted signals of the output data from the data generation circuit 2 upon receiving a signal from the EOR-gate 12.

1 Claim, 6 Drawing Sheets

SELF-DIAGNOSTIC DEVICE FOR SEMICONDUCTOR MEMORIES

BACKGROUND OF THE INVENTION

1. Field of the Invention

The present invention relates in general to devices for testing semiconductor memories, and relates in particular to a self-diagnostic device for high-bit, high-capacity memories used in IC testers.

2. Description of the Related Art

FIG. 6 shows a conventional self-diagnostic testing device for semiconductor memories disclosed in a Japanese Patent Application, First Publication, H6-75023. The device comprises: a CPU 1; a data generation circuit 2; an address generation circuit 3; a comparator 4; a memory matrix 5; a clock generator 6; a test completion detection circuit 7; a switching circuit 8; a flip-flop generation circuit (shortened to FF circuit hereinbelow) 9; divider circuits 10~14; selectors 15~17; and an inversion circuit 18. It should be noted that, in the following description, the terms "signal" and "data" are interchangeable, and refer to a single signal or a group of signals depending on the situation.

The output signal 1B of CPU 1 is [H] for the write-mode and [L] for the read-mode. The output signal 1D is [H] for the checker-mode and [L] for the march-mode. The output signal 1C is inputted to the divider circuit 10 to divide the clock signal 6E generated by the clock generation circuit 6.

The divider circuit 11 divides the clock signal 6A generated by the clock generation circuit 6; the divider circuit 12 divides the clock signal 6B generated by the clock generation circuit 6; the divider circuit 13 divides the clock signal 6D generated by the clock generation circuit 6; and the divider circuit 14 divides the output signal generated by the divider circuit 12.

The selector 15 receives the clock signal 6A outputted from the clock generation circuit 6 and the signal 11A outputted from the divider circuit 11, and selects a clock signal 6A when the output signal 1B from CPU 1 is [H] or output signal 11A, when 1B is [L]. The selector 16 receives the output clock signals 12A, and 14A, respectively, from the divider circuits 12, 14, and selects clock signal 14A when the output signal from the AND-gate 22 is [H], or 12A when it is [L]. The selector 17 receives the inverted signal of the clock signal 6C from the clock generation circuit 6 and the output signal 23A from the gate 23, and selects the output signal 23A from the gate 23 when the output signal 1B from CPU 1 is [H] and selects clock signal 6C from the clock generation circuit 6 when 1B is [L]. The inversion circuit 18 receives output signal from the data generation circuit 2 and the output signal from the AND-gate 20, and provides input data to the switching circuit 8.

The memory matrix 5 receives output data 8A from the switching circuit 8, and accepts write-data in at the output timing of the selector 17. The comparator 4 receives output data from the memory matrix 5 and the output data 8B from the switching circuit 8, and outputs a signal 4A at the timings governed by the NAND-gate 24. The NAND-gate 24 receives output signal 13A from the divider circuit 13 and the inverted data of the output signal 1B of CPU 1.

Before testing the memory matrix 5 using the diagnostic device shown in FIG. 6, it is necessary to establish the test conditions for the various components of the device. First, a range of test addresses must be defined by providing the starting addresses to the address generation circuit 13 according to input data 1A from CPU 1. Similarly, the range of test addresses is provided to the test completion detection circuit 7 by input data 1A. Next, the conditions for testing memory matrix 5 are provided to the address generation circuit 3 and the test completion detection circuit 7. The testing sequence data are entered into the data generation circuit 2 by the input data 1A from CPU 1.

Next, the write-process for the march-mode will be explained. The march-mode refers to a step of initializing all the cells by writing [0], followed by a cell-by-cell read/write step for each one of the cells, and a step of repeating the same sequence of steps for the inverted data. This procedure assures that nearly all the fixation defects in the address system are detected.

The write process for the march-mode comprises inputting [1] or [0] in all the cells to check the writing ability. The sequence of events are as follows. After entering the write conditions as above, the selector 15 is set so as to be [H] when read- or write-mode signal 1B is [H] and checker- or march-mode signal 1D is [L]. Then, CPU 1 inputs a start signal 1C to the clock generation circuit 6 to output a clock signal 6A, and test data are entered into the address generation circuit 3, the data generation circuit 2 and the test completion detection circuit 7.

At this point, the OR-gate 19 is [L], AND-gate 22 is [L] and the selector 16 is set to [L]. The input to the AND-gate 20 (output of the OR-gate 19) is [L] and the output 12A of the divider circuit 12 through the selector 16 is [L], therefore, the output is constant at [L]. Therefore, the output signal 18A from the inversion circuit 18 passes through and is inputted to the switching circuit 8. The output 10A of the divider circuit 10 and the read- or write-mode signal 1B are entered into the OR-gate 21 to provide the output signal at [H]. Therefore, the output from the switching circuit 8 appears on the 8A-side. At this time, by giving the clock signal 6C from the clock circuit 6 to a WE (write enable) terminal, the output of the selector 17 writes test data into the memory in each address.

Next, the read steps for the march-mode in the circuit of FIG. 6 will be explained. When write- or read-mode signal 1B is [L] and checker- or march-mode signal 1D is [L], the selector 15 is set to [L]. Therefore, the output signal 11A from the divider circuit 11 is given to the address generation circuit 3, data generation circuit 2 and the test completion detection circuit 7. At this time, the output signal is [H] from the ON-gate 19, [L] from the AND-gate 22, and output signal 12A from the divider circuit 12 is generated by the selector 16.

In this circuit configuration, the output of the AND-gate 20 is provided to the input of the switching circuit 8, after the output from the divider circuit 12 has gone through the inversion circuit 18 to be subjected to repeated process of through/inversion step. When the output signal 10A from the divider circuit 10 is [H], through-data is outputted on the output 8B-side and the inverted-data is outputted on the 8A-side. When the WE-terminal of the memory matrix 5 is [L], the output from the NAND-gate 23 is forwarded to the selector 17, and the address of the inverted data in the memory matrix 5 is determined by the output of the address generation circuit 3, and this address is written into the memory matrix 5.

When the WE-terminal of the memory matrix 5 is [H], it is in the read-mode, the memory matrix 5 reads the address data from the output of the address generation circuit 3, and this address is inputted to the comparator 4. The comparator 4 compares the read-data from the memory matrix 5 with the output-data from the switching circuit 8 (while controlling the output read-data by WE-terminal), to determine coincidence or non-coincidence. When it is non-coincident, the comparator 4 outputs a non-coincidence signal 4A, which is inputted to the set-terminal of the FF circuit 9 to put the FF circuit 9 into a set-state to output a defect-signal 31.

Next, the write process in a checker board will be explained. The checker board is a device for writing alternating data of [H] and [L] in a checker board pattern to be read out and compared one-by-one. This process not only determines defective cells, but enables to check inter-cell interferences and defective multiplexing ability of the lowermost address bits. In the circuit shown in FIG. 6, when the output 1B of the write-mode of CPU 1 is [H] and the output 1D from the checker- or march-mode is [H], the selector 15 is [H], and the clock signal 6A is generated from the clock generation circuit 6 to be entered into the address generation circuit 3, data generation circuit 2 and the test completion detection circuit 7.

At this point, the OR-gate 19 is [H], the AND-gate 22 is [L], and output signals are set in the selector 16. Because the output of the OR-gate 19 is [H] and the input data is to the AND-gate 20, the output signal from the AND-gate 20 is the output 12A of the divider circuit 12. Therefore, the inverted circuit 8 outputs a signal 8A which alternately shows a through/inversion signal, and because the input signal to the OR-gate 21 is [H], the switching circuit 8 is [H], and the signal is outputted on the inverted-side 8A.

By operating the clock signal 6C from the clock generation circuit 6 on the WE-terminal of the memory matrix 5, the output data from the selector 17 are inverted and written into the memory matrix 5 as [H] [L] [H] [L] for each address.

Next, read-mode of the checker-board will be explained. When read- or write-mode signal 1B from CPU 1 is [L] and the output signal 1D of the checker- or march-mode is [H], the selector 15 is set to [L]. The output signal 11A is generated by the divider circuit 11 and is entered into the address generation circuit 3, data generation circuit 2 and the test completion detection circuit 7. At this point, the OR-gate 19 is [H] and the input to the AND-gate 22 is [H].

Also, the output signal 14A from the division circuit 14 is inputted to the selector 16. Therefore, the output of the AND-gate 20 is the output of the divider circuit 14 which is inputted to the inversion circuit 18. The output data repeat the process of through/inversion to be forwarded to the input of the switching circuit 8. The output signal 10A from the divider circuit 10 is inputted in the switching circuit 8, and the through-data are outputted on the 8B-side and the inverted-data are outputted on the inverted-side 8A. The subsequent steps are the same as in the march read-mode.

The selector 15 selects one of either the output signal 11A from the divider circuit 11 or the clock signal 6A from the clock generation circuit 6, and the address of the address generation circuit 3 is made to be +1 or −1, and the data in the data generation circuit 2 is made to be +1 or −1 or unchanged. Simultaneously, the test completion detection circuit 7 starts counting down according to the signal from the output of the selector 15, and when the count becomes [0], the testing is deemed to be completed. At this point, the test completion signal is generated to be inputted to the clock generation circuit 6. When the test completion signal is received, the clock generation circuit 6 stops the clock generation process.

As described in some detail above, the performance of the conventional self-diagnostic device for detecting defects in the memory matrix is basically governed by the cycle timing of the clock signals 6A, 6B, 6C, 6E and 6D generated from the clock signal generation circuit 6. The generated clock signals must be operated on further by the respective division circuits to generate individual signals for checking the memory matrices. Therefore, although the conventional device is highly effective in finding defective cells because of the provisions of the march-mode for checking the address configuration and the checker-mode for evaluating the individual cell performance, the device requires five division circuits, three selector circuits and six gates. The circuit configuration is thus complex and cumbersome, and the circuit design is unnecessary on a grand scale.

SUMMARY OF THE INVENTION

It is an object of the present invention to provide a self-diagnostic device, for checking defects in a high bit, high capacity semiconductor memory circuit, having a circuit design that is comparatively simple and small-scale yet capable of simultaneously performing march and checker modes to find defective cells in the memory quickly and accurately.

The object is achieved in a self-diagnostic device comprising: a CPU containing a diagnostic test program for generating a write-mode signal and a test-start signal; a data generation circuit for generating expected data to be written into and read out of a memory matrix; an address generation circuit for generating address data to be written into and read out of the memory matrix; a clock generation circuit activated by the test-start signal for generating first clock signal, second clock signal, third clock signal and fourth clock signal; a test completion detection circuit for detecting a completion of the diagnostic test program to stop operation of the clock generation circuit; an OR-gate for inputting the fourth clock signal and the test-start signal; a first flip-flop circuit for receiving the second clock signal to be a set-signal and receiving an output signal generated by the OR-gate to be a reset-signal; a first EOR-gate for receiving an output signal form a lowermost bit of addresses generated by the address generation circuit and an output signal generated by the flip-flop circuit; a second EOR-gate for receiving an output signal from the data generation circuit and an output signal from the first EOR-gate, and inputting an inverted or a non-inverted signal of the output signal generated by the data generation circuit to a comparator and to the memory matrix; a NOT-gate for receiving the third clock signal and generating an inverted output signal to be inputted to a write-enable terminal of the memory matrix; a NAND-gate for receiving the write-mode signal and the first clock signal; a comparator for receiving first data having read-data generated by the memory matrix and second data having expected-data generated by the EOR-gate, wherein a decision to compare or not to compare a coincidence or a non-coincidence of the first data and second data is made in accordance with an enable-signal generated by the NAND-gate; and a second flip-flop circuit for receiving an output signal generated by the comparator to be a set-signal for stopping a test and accepting the test-start signal generated by the CPU as a reset-signal for restarting the test.

According to the self-diagnostic device of the present invention comprising the components presented above, the scale of the circuit configuration is small relative to that of the conventional device having five division circuits, three selector circuits and six logic-gates, and that the present circuit configuration can be fabricated more readily than the conventional circuit configuration.

Furthermore, the present device is designed to be compatible with the march- and checker-modes of the conventional device so as to avoid the need for extensive software development efforts so as to provide a cost effective self-diagnostic device of high precision and dependability.

DESCRIPTION OF THE PREFERRED EMBODIMENTS

Figure 1:
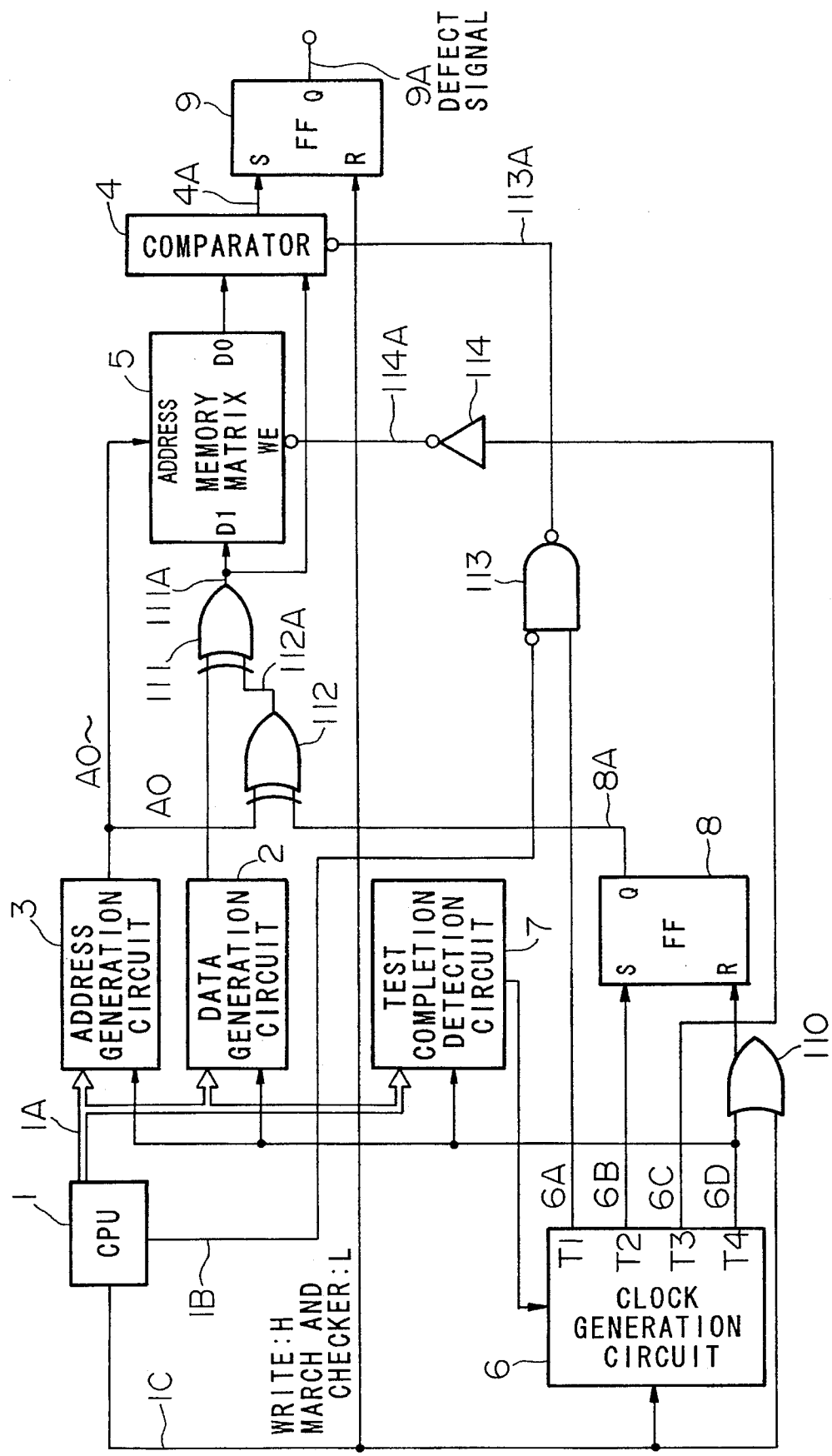
FIG. 1 is a schematic block diagram of an embodiment of the self-diagnostic device of the present invention.
Figure 6:
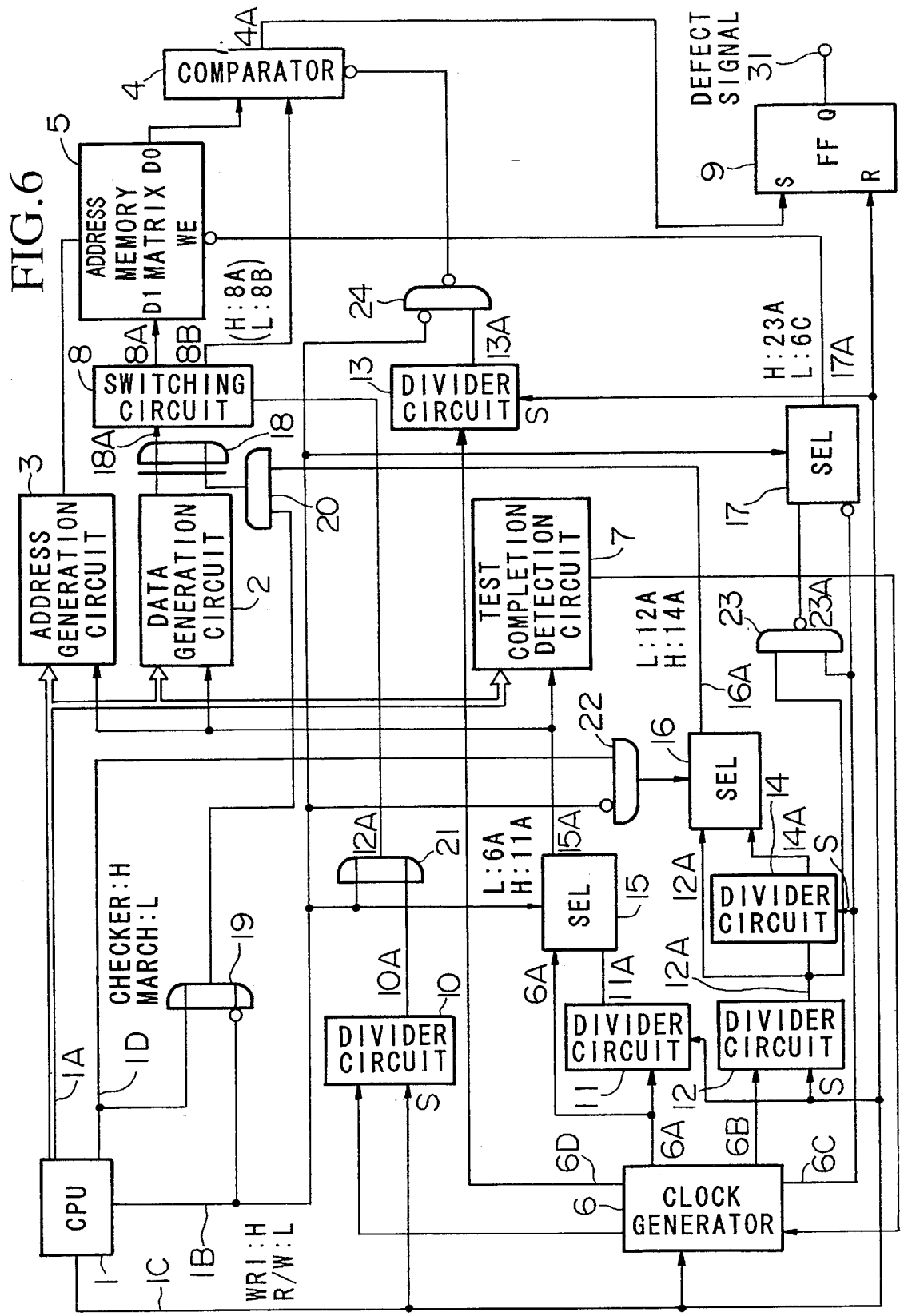
FIG. 6 is a memory testing circuit in a conventional self-diagnostic device.

FIG. 1 shows a block diagram of the self-diagnostic device of the present invention. When the components are the same as those in the conventional device shown in FIG. 6, the same reference numerals are used, and their detailed explanations are omitted.

The device comprises: a CPU 1; a data generation circuit 2; an address generation circuit 3; a comparator 4; a memory matrix 5; a clock generation circuit 6; test completion detection circuit 7; flip-flop circuits 8, 9; an OR-gate 110; EOR-gates 111, 112; a NAND-gate 113; a NOT-gate 114. The CPU 1 is [H] for the write-mode and [L] for the march- and checker-modes.

The conditions to be installed in checking the memory matrix 5 using the device of FIG. 1 are as follows. Input data 1A from CPU 1 provide the starting address for the test range of addresses to the address generation circuit 3. Similarly, input data 1A provide the test range of addresses to the test completion detection circuit 7.

Figure 2:
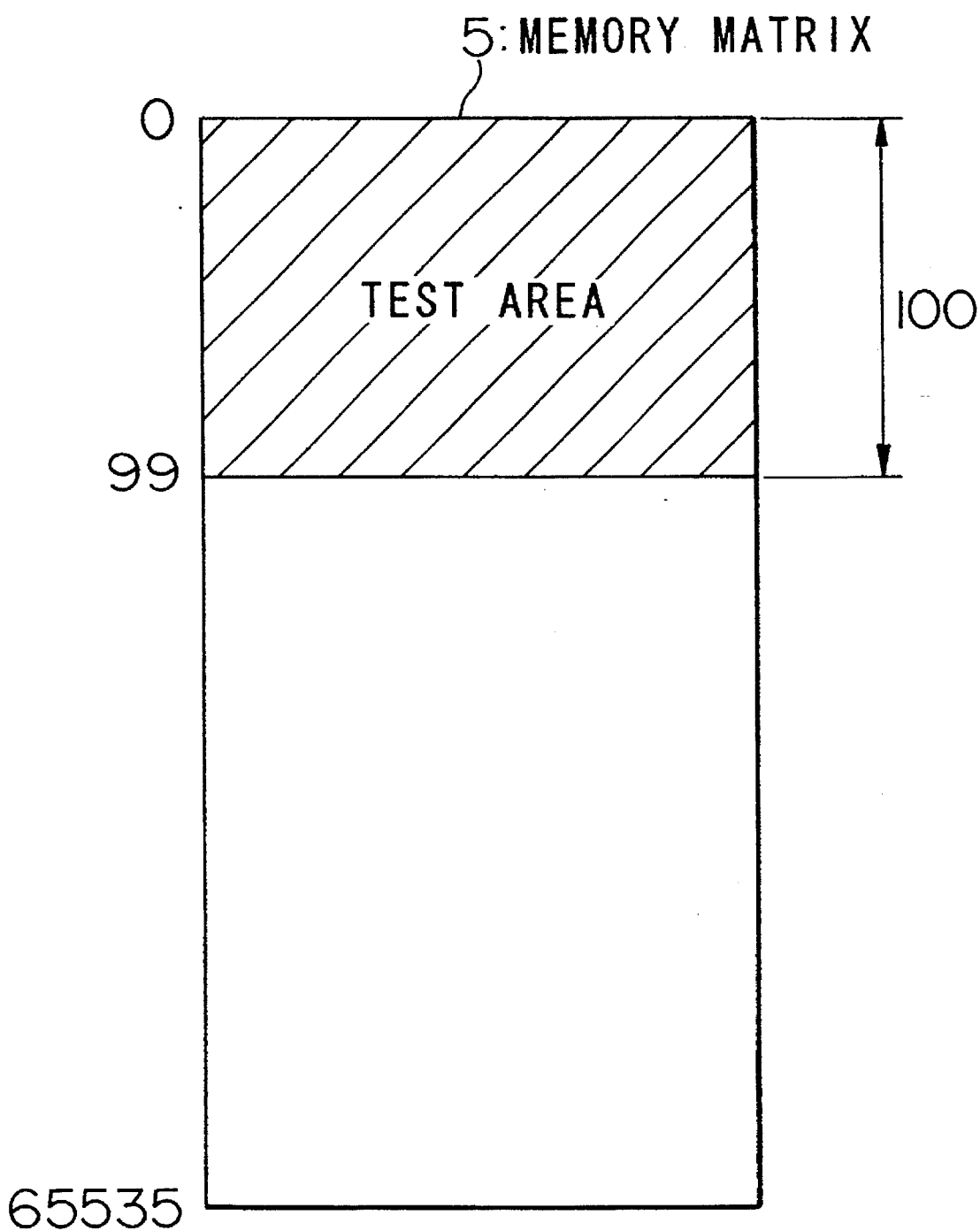
FIG. 2 is an example of the memory matrix to be tested with the device shown in FIG. 1.

An example of the testing conditions for testing a memory matrix 5 of 64 K capacity will be explained with reference to FIG. 2. Assume that the test range is from 0 to 99 th address of the 64 K memory. The address generation circuit 3 is set to [0] and the test completion detection circuit 7 is set to 100 (99−0+1). The test data are inputted to the data generation circuit 2 by input data 1A from CPU 1.

The write process for the march- and checker-modes of the device shown in FIG. 1 will be explained. The term "march" refers to a process of writing [0]s in all the memory cells, and after reading out cells one-by-one, the inverted data are read-in repeatedly, and the same sequence for the inverted data is repeated. This procedure nearly completely detects the fixation defects of the address memory cells. The term "checker" refers to a process of writing alternating data of [H] and [L] in a checker-board pattern to be read out one-by-one and to be compared. This process not only determines defective cells, but allows checking inter-cell interferences and defective multiplexing selection of the lowermost address bits.

First, the checker data are written into the entire addresses. In this condition, the write-mode signal 1B from CPU 1 is [H], which makes the output of the NAND-gate 113 to be [H], and, when inputted to the enable-terminal of the comparator 4, incapacitates the comparator 4.

When a start signal 1C is inputted to the clock generation circuit 6 by CPU 1, the clock generation circuit 6 becomes operational and successively generates clock signals in the order 6A, 6B, 6C and 6D. The start signal 1C is forwarded via OR-gate 110 to FF circuit 8 as the reset signal, which makes the output of FF circuit 8 to be [L].

The clock signal 6A is inputted to the NAND-gate 113, but it is not accepted because the write-mode signal 18 from CPU 1 is [H]. The clock signal 6B which is the reset signal for FF circuit 8 makes the output of FF circuit 8 to be [H] which is entered into the EOR-gate 112. The EOR-gate 112 selects the lowermost bit A0 from the output address data of the address generation circuit 3 and outputs an operated signal 112A which is inputted to the EOR-gate 111.

The output signal from the data generation circuit 2 is entered into the EOR-gate 111, and either the inverted or the non-inverted data, operated by the inversion signal 112A from the EOR-gate 112, is entered as the input data in the memory matrix 5. The clock signal 6C is inverted by the NOT-gate 114, and applied to the WE(write enable)-terminal of the memory matrix 5 to write in the data. The clock signal 6D is entered into the address generation circuit 3, data generation circuit 2 and the test completion detection circuit 7, followed by writing the data. The process is repeated until the test completion detection circuit 7 outputs a test completion signal to stop the operation of the clock generation circuit 6, and the data [0101 . . . ] are written for each address in the memory cells.

Next, read and write steps for the march- and checker-modes will be explained. In this case, the write-mode signal 1B from CPU 1 is [L] which is inputted to the NAND-gate 113 whose output 113A is controlled by the clock signal 6A. The input data 1A from CPU 1 inputs the same data used for write process in the address generation circuit 3, test completion detection circuit 7, and inverted data are inputted to the data generation circuit 2.

When the start signal 1C from CPU 1 is inputted to the clock generation circuit 6, the clock generation circuit 6 generates successive clock signals in the order 6A, 6B, 6C and 6D. The clock signal 6A is inputted to the NAND-gate 113. In this case, the write-mode signal 1B from CPU 1 is [L], the clock signal 6A is inverted to be inputted as an enable-signal to the comparator 4 to compare the output data of memory matrix 5 with the expected data 111A from the EOR-gate 111 to determine the data coincidence or non-coincidence.

If the comparison-result shows non-coincidence the comparator 4 outputs a non-coincidence signal 4A to be inputted to the set-terminal of FF circuit 9 which goes into the set-mode, and generates a defect signal 9A. The clock signals 6B, 6C and 6D perform the same steps as those in the write process for the march- and checker-modes. These steps are repeated until the test completion detection circuit 7 outputs a test stop signal to stop the operation of the clock generation circuit 6. For each address, the process of writing data is continued, for example, write 0 for zero address, after read is 1: write first address 1 after read is 0: write second address 0 after read is 1: write next address and so on. This process is performed for the entire addresses in the memory matrix 5 to perform self-diagnosis of its memory cells.

Figure 3:
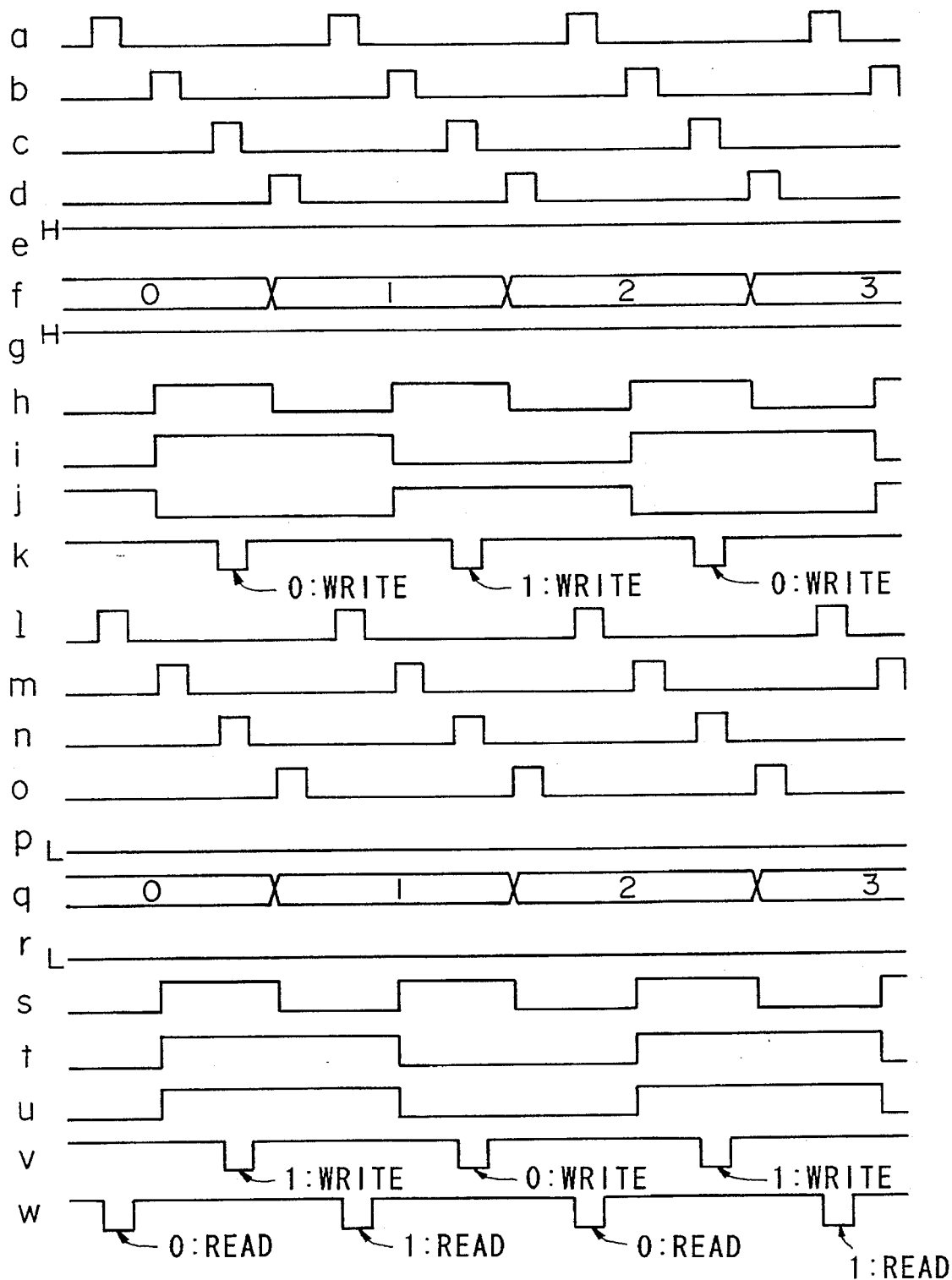
FIG. 3 is a comparison of waveforms in the various components of the device, and the relative timing of testing signals.

FIG. 3 shows the timing charts for write-mode and read/write-mode in the march- and checker-modes for the device shown in FIG. 1. FIG. 3 shows various output waveforms (a), (b), (c) and (d) from the clock generation circuit 6. Specifically, (a) refers to clock signal 6A; (b) to clock signal 6B; (c) to clock signal 6C and (d) to clock signal 6D. FIG. 3 also shows waveform (e) for the write-mode signal 1B of CPU 1, which remains constant at the H-level. Waveform (f) shows the output signal from the address generation circuit 3 and an address is generated synchronously with the clock signal 6D shown in (d). Waveform (g) shows the output signal from the data generation circuit 2, and remains constant at the H-level. Waveform (h) refers to the output signal 8A from the FF circuit 8, and becomes H-level synchronously with the clock signal 6B and becomes L-level synchronously with the clock signal 6D Waveform (i) refers to the output signal 12A from the EOR-gate 12, and becomes an inverted signal of the write data in memory matrix 5 by entering of the lowermost bit signal A0 in the address generation circuit 3 and the EOR-output signal shown in (h).

Waveform (j) refers to the output signal 111A from the EOR-gate 111, and become data to be written into memory matrix 5 by inputting of EOR-output signals shown by waveforms (g) and (i). Waveform (k) refers to the output signal 114A from the NOT-gate 114 for inverting the waveform (c) to provide data written into memory matrix 5 so that even addresses are 0 and odd addresses are 1. The time charts represented by the waveforms (a)~(k) shown in FIG. 3 relates to write-mode.

The waveforms (l)~(o) relate to output signals from the clock generation circuit 6, where (l) refers to clock signal 6A, (m) to clock signal 6B, (n) to clock signal 6C and (o) to clock signal 6D. Waveform (p) refers to write-mode signal 1B from CPU 1, and remains constant at the L-level. Waveform (q) refers to the output signal from the address generation circuit 3 and generates address synchronously with waveform (o). Waveform (r) refers to the output signal from the data generation circuit 2, and remains constantly at the L-level. Waveform (s) refers to the output signal 8A from the FF circuit 8, to be at the H-level or L-level synchronously depending on the respective output signal 63 or 6D, generated by the clock generation circuit 6. Waveform (t) refers to the output signal 112A from the EOR-gate 112 and becomes write-data into memory matrix 5 and an inverse signal of the expected data from the read-data of memory matrix 5, when operated by the lowermost-bit in the output addresses in the address generation circuit 3 and the EOR output signal represented by waveform (s) in FIG. 3. Waveform (u) refers to the output signal 111A from the EOR-gate 111 to be write-data in memory matrix 5 and expected data from the read-data in memory matrix 5.

Waveform (v) refers to the output signal 114A from the NOT-gate 114, and inverts waveform (n) to become write-data of memory matrix 5 so that even addresses are 1 and odd addresses are 0. Waveform (w) refers to the output signal 113A from the NAND-gate 113, and, because waveform (p) is constantly at the L-level, inverts the waveform (l) to provide the enable signal for the comparator 4 so that even addresses are to expect a 1 and odd addresses are to expect a 0. Waveforms (l)~(w) refer to output signals from the march- and checker-modes and their respective time charts.

Figure 4:
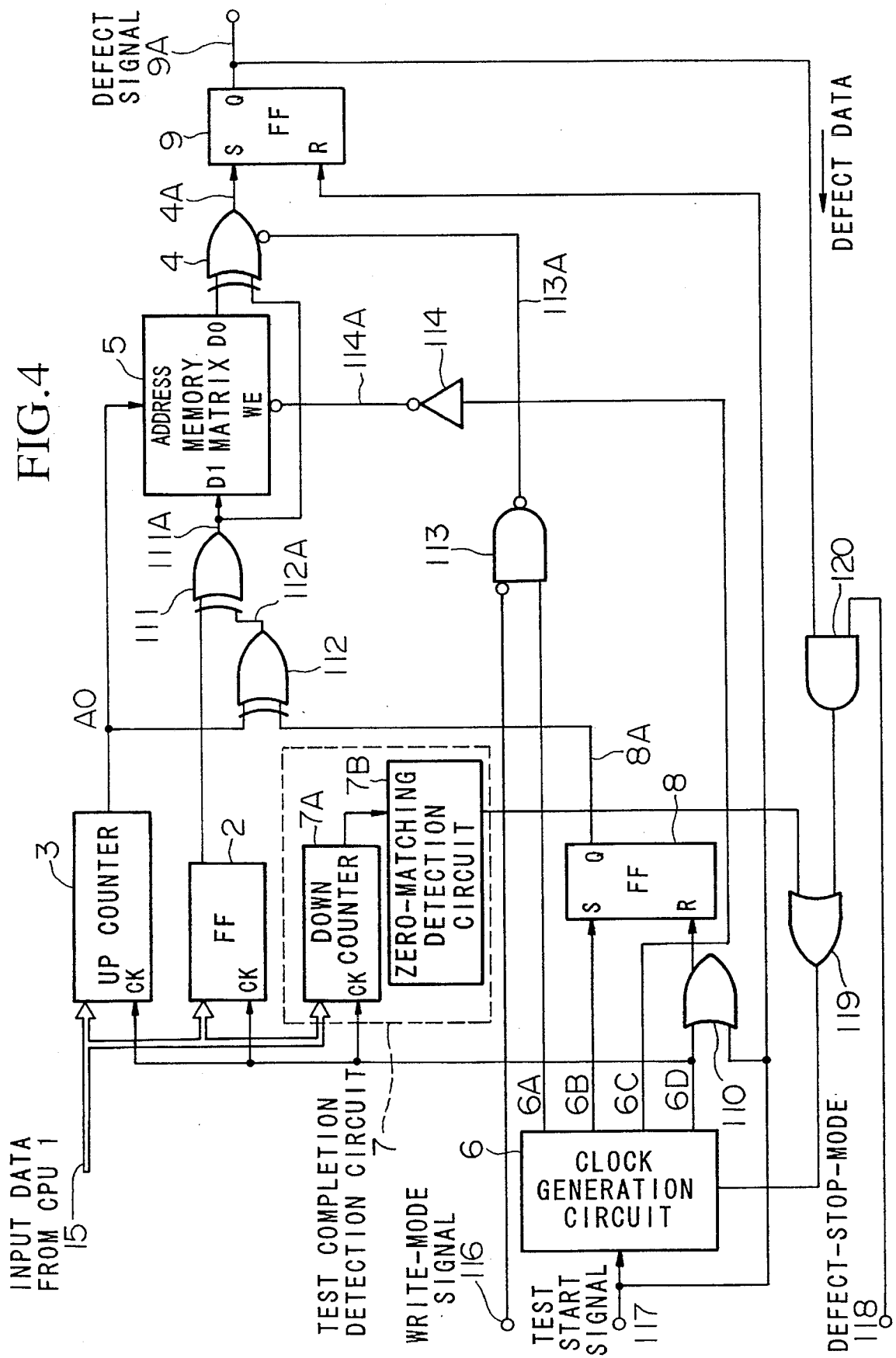
FIG. 4 is an example of the circuit configuration of the self-diagnostic device shown in FIG. 1.

FIG. 4 shows a circuit configuration of the device shown in FIG. 1. The device utilizes an FF circuit for data generation circuit 2, an up-counter for the address generation circuit 3 and a down-counter for the test completion detection circuit 7. The input data 15 is supplied to each of the input terminals of the FF circuit 2, the up-counter 3 and a down-counter 7A of the test completion detection circuit 7. The output of the address generation circuit (up-counter) 3 is connected to the address-input terminal of the memory matrix 5 whose lowermost bit signal A0 is inputted to the input terminal of the EOR-gate 12. The output of the data generation circuit (FF circuit) 2 is connected to the input terminal of the EOR-gate 111.

The test-start signal 117 is forwarded to the input reset terminal in the FF circuit 9, and to the input terminals of the clock generation circuit 6 and the OR-gate 110. The write-mode signal 116 is forwarded to the input terminal of the NAND-gate 113, and controls the comparison step for comparing the read-mode data of the memory matrix 5 with the expected data. The clock signal 6A from the clock generation circuit 6 is inputted to the input terminal of the NAND-Kate 113, and the output signal 113A from the NAND-gate 113 is inputted to the enable terminal of the comparator (EOR-gate) 4.

The output signal 6B from the clock generation circuit 6 is forwarded to the set-terminal of the FF circuit 8. The output signal 6C from the clock generation circuit 6 is forwarded to the input terminal of the NOT-gate 114 which inputs the inverted signal 114A to the WE-terminal of the memory matrix 5. The clock signal 6D from the clock generation circuit 6 is forwarded to the OR-gate 110 whose output is connected to the reset-terminal of the FF circuit 8. The output signal 8A from the FF circuit 8 is forwarded to the input terminal of the EOR-gate 112 whose output signal 112A is forwarded to the input terminal of the EOR-gate 111.

The output signal 111A from the EOR-gate 111 is forwarded to the input terminals of the memory matrix 5 and the comparator (EOR-gate) 4. The output data from the memory matrix 5 is forwarded to the input terminal of the comparator 4 whose output is connected to the set-terminal of the FF circuit 9 whose output signal 9A is forwarded the input terminal of the AND-gate 120 and to an external terminal. The FF circuit 9 goes into a set-state only when defective memory cells are found.

The output of the down-counter 7A is connected to the zero-matching detection circuit 7B which detects [0] in the output of the down-counter 7A, and is connected to the input terminal of the OR-gate 119.

The defect-stop-mode 118 is connected to the AND-gate 120, whose output is connected to the input terminal of the OR-gate 119 whose output is connected to the clock generation circuit 6.

The OR-gate 119 operates on the output signals from both the zero-matching detection circuit 7B and the AND-gate 120, thus, when one of the signals is [H], a signal is forwarded to the clock generation circuit 6 to finish the test. When the defect-stop-mode is [H], the AND-gate 120 outputs error data 9A from the FF circuit 9 to the OR-gate 119.

As described above, if it is desired to finish the test at the detection of a first defect, the defect-stop-mode 118 is maintained at [H], then the detection event of the first defect stops the clock generation circuit 6, and the output signals 6A, 6B, 6C and 6D from the clock generation circuit 6 are all ceased.

At this point, the value of the up-counter 3 shows the address of the defective cell in the memory matrix 5. Further, after the completion of the test, the condition of the FF circuit 9 identifies the defective cells and bits in the memory matrix 5. In the case of IC testing, the test patterns involve data of high length bits, and in such a case, the comparator (EOR-gate) 4, EOR-gate 111 and the FF circuits 2, 9 should be upgraded by the same number of bits, and the device should be provided with an extra OR-gate 21.

When the memory matrix 5 are interleaved, the lowermost bit address signal A0 connected to the EOR-gate 112 may be replaced with the uppermost address bit, then the checker-mode can perform read/write modes in each leaf memory.

Figure 5:
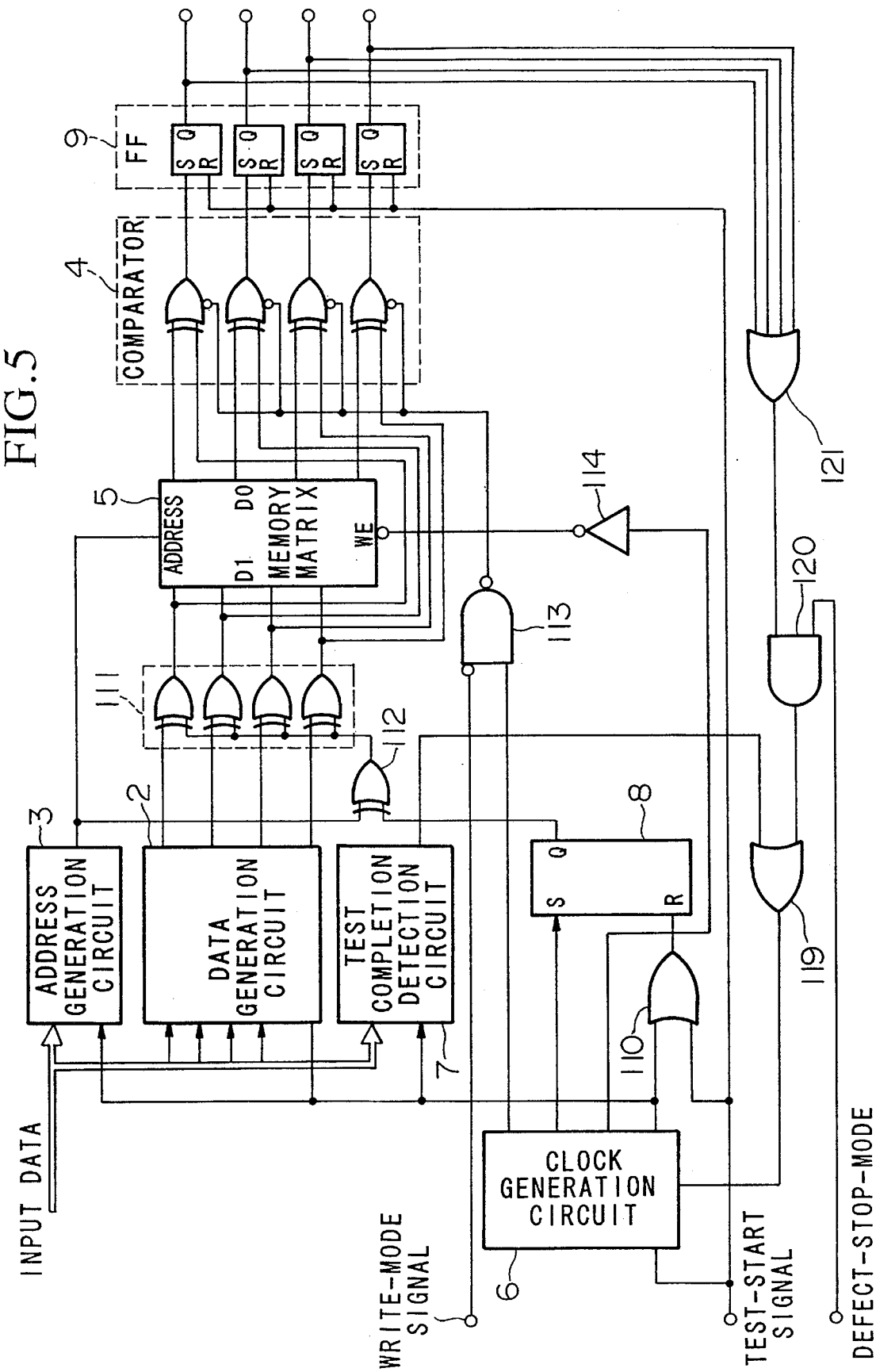
FIG. 5 is a circuit diagram of the device shown in FIG. 4 based on a 4-bit length.

FIG. 5 shows a circuit configuration of FIG. 4 adapted to a 4-bite device. In this case, four each of the EOR-gates and FF circuit 9 are provided to comprise the EOR-gate 111 and the comparator 4.

The self-diagnostic device of the present invention was explained with reference to particular choices of components and circuit configurations used in the embodiment. However, these choices are illustrative and do not limit the invention in any way. It is clear that other choice of components and circuit configurations can be utilized within the principle demonstrated in the present invention that division devices can be replaced with equivalent logic operations and associated logic components to provide simpler and quicker checking of the performance of the memory matrix while retaining the precision and accuracy of the conventional march- and checker-modes in the device.

What is claimed is:

1. A self-diagnostic device for testing semiconductor memories comprising:

a CPU containing a diagnostic test program for generating a write-mode signal and a test-start signal;

a data generation circuit for generating expected data to be written into and read out of a memory matrix;

an address generation circuit for generating address data to be written into and read out of said memory matrix;

a clock generation circuit activated by said test-start signal for generating first clock signal, second clock signal, third clock signal and fourth clock signal;

a test completion detection circuit for detecting a completion of said diagnostic test program to stop operation of said clock generation circuit;

an OR-gate for inputting said fourth clock signal and said test-start signal;

a first flip-flop circuit for receiving said second clock signal to be a set-signal and receiving an output signal generated by said OR-gate to be a reset-signal;

a first EOR-gate for receiving an output signal from a lowermost bit of addresses generated by said address generation circuit and an output signal generated by said first flip-flop circuit;

a second EOR-gate for receiving an output signal from said data generation circuit and an output signal from said first EOR-gate, and outputting an inverted or a non-inverted signal of said output signal generated by said data generation circuit to said memory matrix;

a NOT-gate for receiving said third clock signal and generating an inverted output signal to be inputted to a write-enable terminal of said memory matrix;

a NAND-gate for receiving said write-mode signal and said first clock signal;

a comparator for receiving first data having read-data generated by said memory matrix and second data having expected-data generated by said second EOR-gate, wherein a decision to compare or not to compare a coincidence or a non-coincidence of said first data and second data is made in accordance with an enable-signal generated by said NAND-gate; and a second flip-flop circuit for receiving an output signal generated by said comparator to be a set-signal for stopping a test and accepting said test-start signal generated by said CPU as a reset-signal for restarting said test.

* * * * *